(12) United States Patent
Liaw

(10) Patent No.: US 7,529,117 B2
(45) Date of Patent: May 5, 2009

(54) DESIGN SOLUTIONS FOR INTEGRATED CIRCUITS WITH TRIPLE GATE OXIDES

(75) Inventor: Jhon-Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/715,148

(22) Filed: Mar. 7, 2007

(65) Prior Publication Data
US 2008/0217701 A1    Sep. 11, 2008

(51) Int. Cl.
*G11C 11/00* (2006.01)
(52) U.S. Cl. .................... 365/154; 365/205
(58) Field of Classification Search ............ 365/154, 365/205
See application file for complete search history.

(56) References Cited

U.S. PATENT DOCUMENTS

| | | | | |
|---|---|---|---|---|
| 5,960,289 A | * | 9/1999 | Tsui et al. | 438/275 |
| 6,159,782 A | * | 12/2000 | Xiang et al. | 438/197 |
| 6,248,675 B1 | * | 6/2001 | Xiang et al. | 438/166 |
| 6,265,325 B1 | * | 7/2001 | Cao et al. | 438/763 |
| 6,706,581 B1 | | 3/2004 | Hou et al. | |

* cited by examiner

*Primary Examiner*—Michael T Tran
(74) *Attorney, Agent, or Firm*—Slater & Matsil, L.L.P.

(57) ABSTRACT

An integrated circuit includes a first core circuit and a second core circuits. The first core circuit includes a first MOS device, wherein a first gate dielectric of the first MOS device has a first thickness. The second core circuit includes a second MOS device, wherein a second gate dielectric of the second MOS device has a second thickness less than the first thickness. A first power supply line having a first power supply voltage is connected to the first and the second core circuits a first power supply voltage.

21 Claims, 5 Drawing Sheets

US 7,529,117 B2

DESIGN SOLUTIONS FOR INTEGRATED CIRCUITS WITH TRIPLE GATE OXIDES

TECHNICAL FIELD

This invention relates generally to semiconductor devices, and more particularly to the formation of integrated circuits having triple gate oxides.

BACKGROUND

The thickness of the gate oxides of metal-oxide-semiconductor (MOS) devices is critical to the performance of the MOS devices. There is a constant need for thinner gate oxides to allow for higher-speed devices. Current technology requires gate oxide thicknesses to be about 50 angstroms or less. However, for ultra-thin silicon dioxide gates, leakage currents will increase tremendously as the thickness is reduced. This will cause a high standby current in the standby mode ($I_{OFF}$) and high standby power consumption, thereby making products with these devices commercially unacceptable. Therefore, reducing standby power consumption and improving performance are often conflicting requirements.

In high end products, there is a need to form devices having multiple gate oxide thicknesses on a same chip. For example, circuits for input/output (I/O) connections, circuits with high performance, and circuits with low power consumption must be fabricated on a same chip, each having a gate oxide thickness, hence the respective chip is referred to as a triple gate oxide chip. The use of triple gate oxides satisfies requirements of both low standby power consumption and high performance. For example, low power-consumption circuits may have thick gate oxides, and thus having low standby currents and low leakage currents. High performance circuits, on the other hand, have thinner gate oxides, and thus have higher speeds.

Triple gate oxide chips, however, require triple power supplies with triple power supply voltages in order to achieve desired effects. Particularly, problems arise if the high performance circuits and the low standby power-consumption circuits both include static random access memory (SRAM) cells and share a common power supply voltage. If the desired power supply voltage of high performance circuits, which supply voltage is typically low, is used for both circuits, the SRAM cells in the low standby power-consumption circuits may not be able to function correctly due to inadequate read and/or write margins. If, however, the power supply voltage is increased to allow the low standby power consumption circuits to work correctly, the power consumption on the high performance circuits is undesirably increased. Accordingly, a solution is needed.

SUMMARY OF THE INVENTION

In accordance with one aspect of the present invention, an integrated circuit includes a first core circuit and a second core circuit. The first core circuit includes a first MOS device, wherein a first gate dielectric of the first MOS device has a first thickness. The second core circuit includes a second MOS device, wherein a second gate dielectric of the second MOS device has a second thickness less than the first thickness. A first power supply line having a first power supply voltage is connected to the first and the second core circuits.

In accordance with another aspect of the present invention, an integrated circuit includes an input/output (I/O) circuit comprising a first MOS device, wherein a first gate dielectric of the first MOS device has a first gate dielectric thickness. A first power supply line is connected to the I/O circuit, wherein the first power supply line has a first power supply voltage. A second power supply line is electrically isolated from the first power supply line, wherein the second power supply line has a second power supply voltage. A first core circuit comprising a second MOS device having a second gate dielectric thickness less than the first gate dielectric thickness, wherein the first core circuit comprises a voltage generator connected to the second power supply line and outputting generated voltages different from the second power supply voltage to a plurality of outputs, and a first static random access memory (SRAM) array having a first plurality of VCC lines, each connected to one of the plurality of outputs of the voltage generator. The integrated circuit further includes a second core circuit comprising a third MOS device having a third gate dielectric thickness less than the second gate dielectric thickness, wherein the second core circuit comprises a second SRAM array having a second plurality of VCC lines connected to the second power supply line.

In accordance with yet another aspect of the present invention, an integrated circuit includes an input/output (I/O) circuit comprising a first MOS device, wherein a first gate dielectric of the first MOS device has a first thickness, and a first power supply line having a first power supply voltage connected to the I/O circuit. A second power supply line having a second power supply voltage less than the first power supply voltage is provided. The integrated circuit further includes a first core circuit comprising a voltage generator connected to the second power supply line and outputting generated voltages different from the second power supply voltage to a plurality of outputs, and a first SRAM array having a first plurality of VCC lines, each connected to one of the plurality of outputs of the voltage generator. The integrated circuit further includes a second core circuit comprising a second SRAM array having a second plurality of VCC lines connected to the second power supply line, wherein first SRAM cells in the first SRAM array and second SRAM cells in the second SRAM array have different dimensions.

By using the embodiments of the present invention, core circuits having different gate dielectric thicknesses can share a common power supply voltage.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel integrated circuit having triple gate oxides and the implementations are illustrated. The variations and operation of the preferred embodiments are then discussed. Throughout the various views and illustrative embodiments of the present invention, like reference numbers are used to designate like elements.

Figure 1:
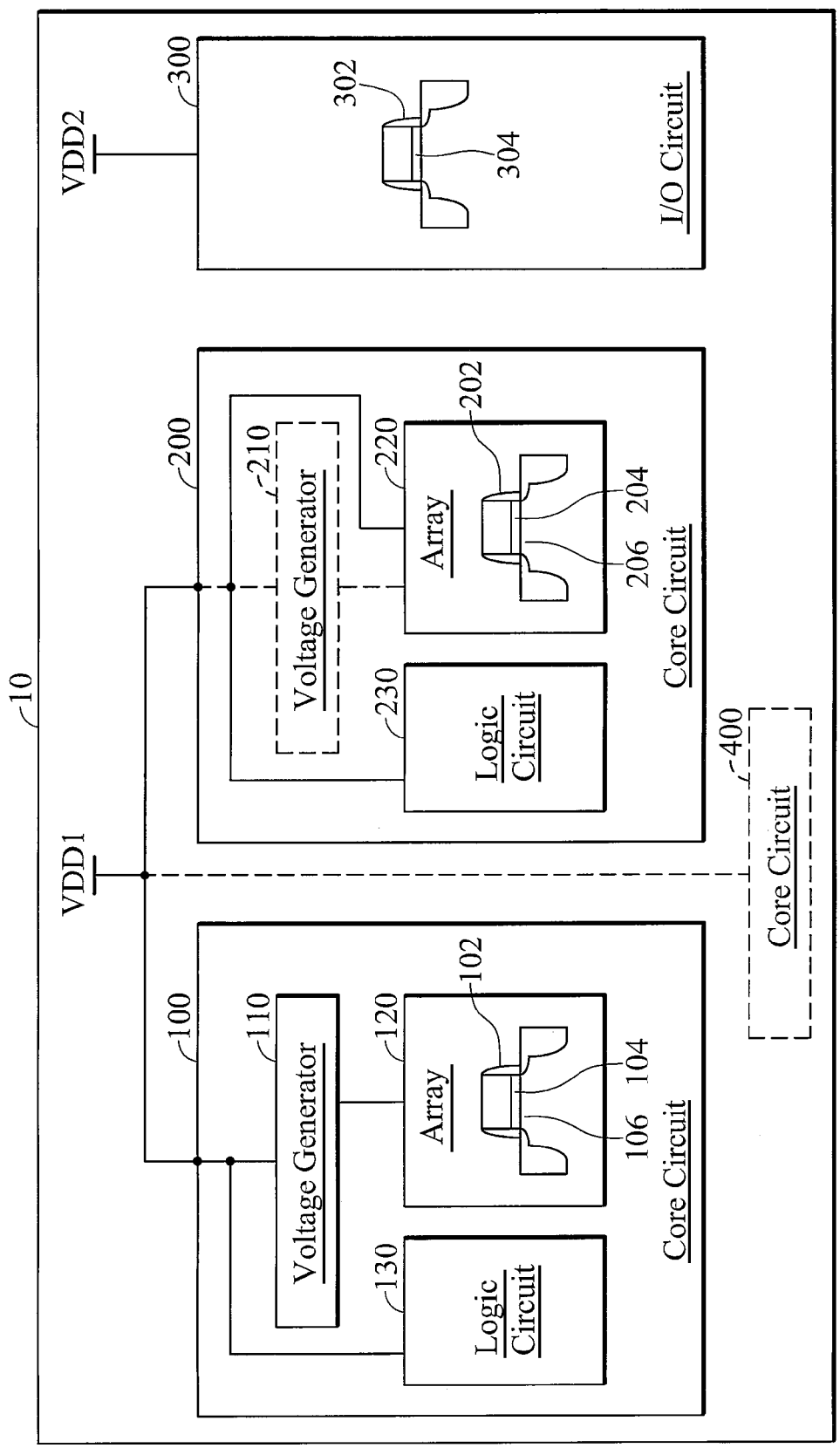
FIG. 1 illustrates a block diagram of an embodiment of the present invention, wherein a common power supply voltage is shared by two core circuits, each having a MOS device with a different gate dielectric thicknesses from the others.

FIG. 1 schematically illustrates a block diagram of an embodiment of the present invention. A semiconductor chip includes three integrated circuits, core circuit 100, core circuit 200, and input/output (I/O) circuit 300. Preferably, metal-oxide-semiconductor (MOS) devices in core circuit 100, which are symbolized by a schematically illustrated MOS device 102, have low leakage currents and low standby power consumption. Exemplary circuits or devices in core circuit 100 include radio-frequency circuits, random logic circuits, selectors, decoders, AND gates, NAND gates, and the like. MOS devices in core circuit 200, which are symbolized by a schematically illustrated MOS device 202, have higher speeds and lower active power consumption than the MOS devices in core circuit 100. Exemplary circuits or devices in core circuit 200 include random logic circuits, selectors, decoders, AND gates, NAND gates and like. Preferably, gate dielectric 204 of MOS device 202 has a lesser thickness than gate dielectric 104 of MOS device 102, and channel 206 of MOS device 202 has a smaller length than channel 106 of MOS device 102. As a result, the MOS devices in core circuit 100 have higher threshold voltages and lower standby power consumption, lower leakage currents, while the MOS devices in core circuit 200 have lower threshold voltages, lower active power consumption, higher speeds, and higher leakage currents. Gate dielectric 304 of MOS device 302, which symbolizes the MOS devices in the I/O circuit, is thicker than gate dielectrics 104 and 204.

Core circuit 100 and core circuit 200 are powered by a first power supply voltage VDD1. I/O circuit 300 is powered by a second power supply voltage VDD2. Preferably, voltage VDD2 is higher than voltage VDD1. Core circuit 100 may include static random access memory (SRAM) array 120. Voltage generator 110 is connected to power supply voltage VDD1 and generates generated voltages for operating the SRAM cells in SRAM array 120, wherein the generated voltages may be higher and/or lower than voltage VDD1. Core circuit 100 further includes logic circuit 130 including non-memory devices, wherein logic circuit 130 is preferably operated by power supply voltage VDD1.

In an embodiment, the MOS devices in core circuit 200 are operated by power supply voltage VDD1 directly. Core circuit 200 may include SRAM array 220. In the preferred embodiment, the SRAM cells in SRAM array 220 are operated by voltage VDD1 directly, and thus no voltage generators are needed. In other embodiments, core circuit 200 includes voltage generator 210, which generates the generated voltages different from voltage VDD1 for operating the SRAM cells in SRAM array 220. Core circuit 200 may further include logic circuit 230 having non-memory devices, wherein logic circuit 230 is operated by power supply voltage VDD1. In yet other embodiments, core circuit 400 may further be included, and the gate dielectrics of the MOS devices (not shown) in core circuit 400 have a different thickness from gate dielectrics 104 and 204. Core circuit 400 may be connected to supply voltage VDD1.

Since MOS devices in array 120 and array 220 are designed differently, they can be used for different purposes. In an exemplary embodiment, array 120 is part of a level-2 (L2) cache memory, while array 220 is part of a level-1 (L1) cache memory. It is noted that although SRAM arrays are used as examples to explain the concept of the present invention, other types of memories, such as dynamic random access memory (DRAM) arrays, may also be used. For example, array 120 may be a DRAM array, and array 220 may be an SRAM array, wherein the MOS devices in the DRAM array have a greater thickness than the MOS devices in the SRAM array.

Figure 2:
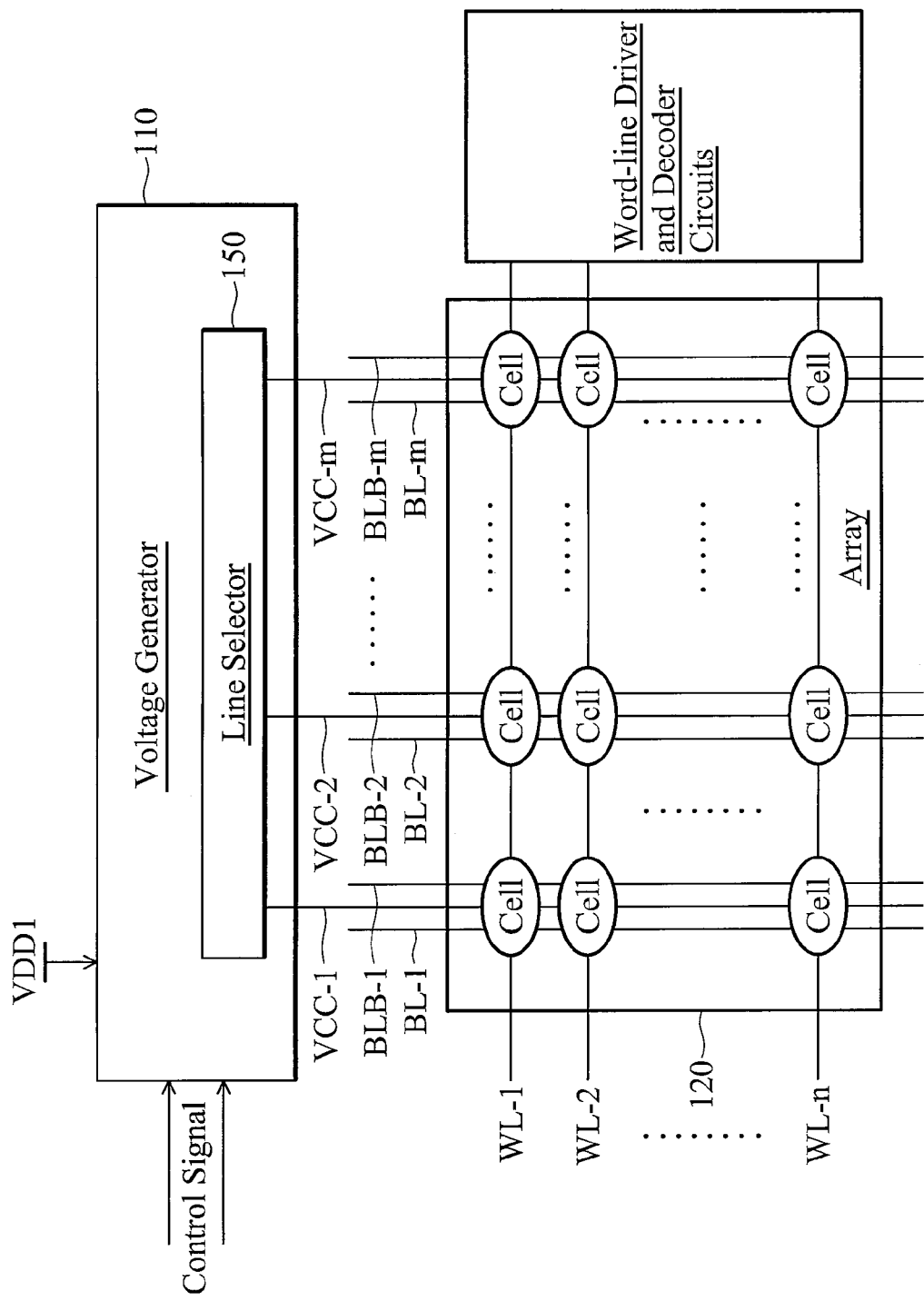
FIG. 2 schematically illustrates a voltage generator for generating generated voltages different from a power supply voltage, and a memory array whose VCC lines receive the generated voltages.

FIG. 2 illustrates a portion of core circuit 100. Voltage generator 110 has two functions, generating the generated voltages, for example, VCC voltages, different from the input power supply voltage VDD1, and multiplexing the generated voltages to different portions of SRAM array 120. Throughout the description, the generated voltages are used as VCC voltages of SRAM array 120. However, the generated voltages can also be used for other portions of SRAM array 120, such as bit-lines and/or word-lines. Control signal lines, which carry control signals, may be connected to voltage generator 110, so that different generated voltages may be generated and/or multiplexed based on the operations (read or write) to be performed on SRAM array 120. The SRAM cells in SRAM array 120 are arranged in rows and columns. In an embodiment, assuming SRAM array 120 has n rows and m columns, word-lines WL-1 through WL-n are in the row direction, and are controlled by a word-line driver and decoder circuit. Voltages on the word-lines WL-1 through WL-n are preferably equal to power supply voltage VDD1 if the corresponding row is selected. VCC lines VCC-1 through VCC-m and bit-lines BL-1 through BL-m, and BLB-1 through BLB-m are in the column direction. Each of the VCC lines VCC-1 through VCC-m may be supplied with a generated voltage, which may be different from the voltages on other VCC lines.

Figure 3:
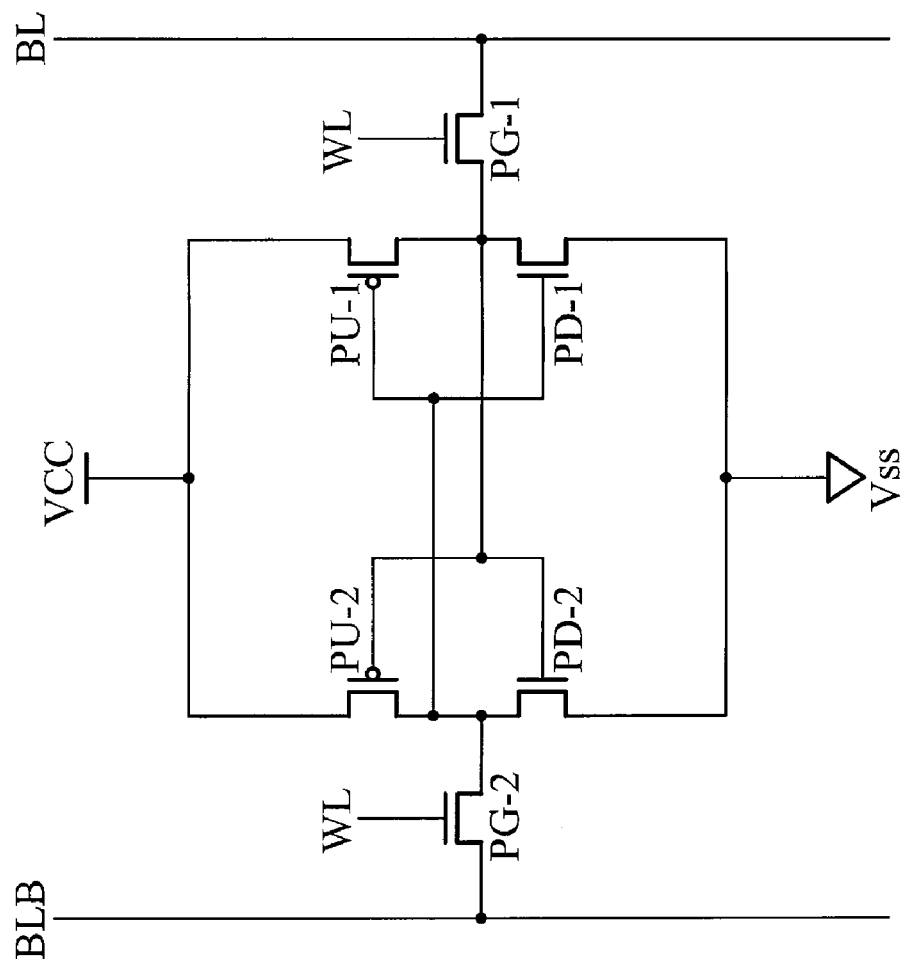
FIG. 3 illustrates an exemplary memory cell for receiving the generated voltages.

FIG. 3 illustrates a circuit diagram of a well-known six-transistor (6T) SRAM cell, which includes pass-gate MOS devices PG-1 and PG-2, pull-up MOS devices PU-1 and PU-2, and pull-down MOS devices PD-1 and PD-2. The SRAM cell is connected to bit-lines BL and BLB, which are among bit-lines BL-1 through BL-m, and BLB-1 through BLB-m, respectively. The SRAM cell is powered through a VCC node, which is connected to one of the VCC lines VCC-1 through VCC-m. Preferably, the MOS devices in array 120 are designed differently from the MOS devices in array 220 to optimize circuit performance. More details are provided in subsequent paragraphs. The SRAM cells in array 120 may have different sizes from the SRAM cells in array 220. For example, if optimization tuning performed in the formation processes is based on array 120, the SRAM cells in array 120 will have a smaller size than the SRAM cells in array 220. Conversely, if the optimization tuning is based on array 220, the SRAM cells in array 220 will have a smaller size than the SRAM cells in array 120.

Figure 4:
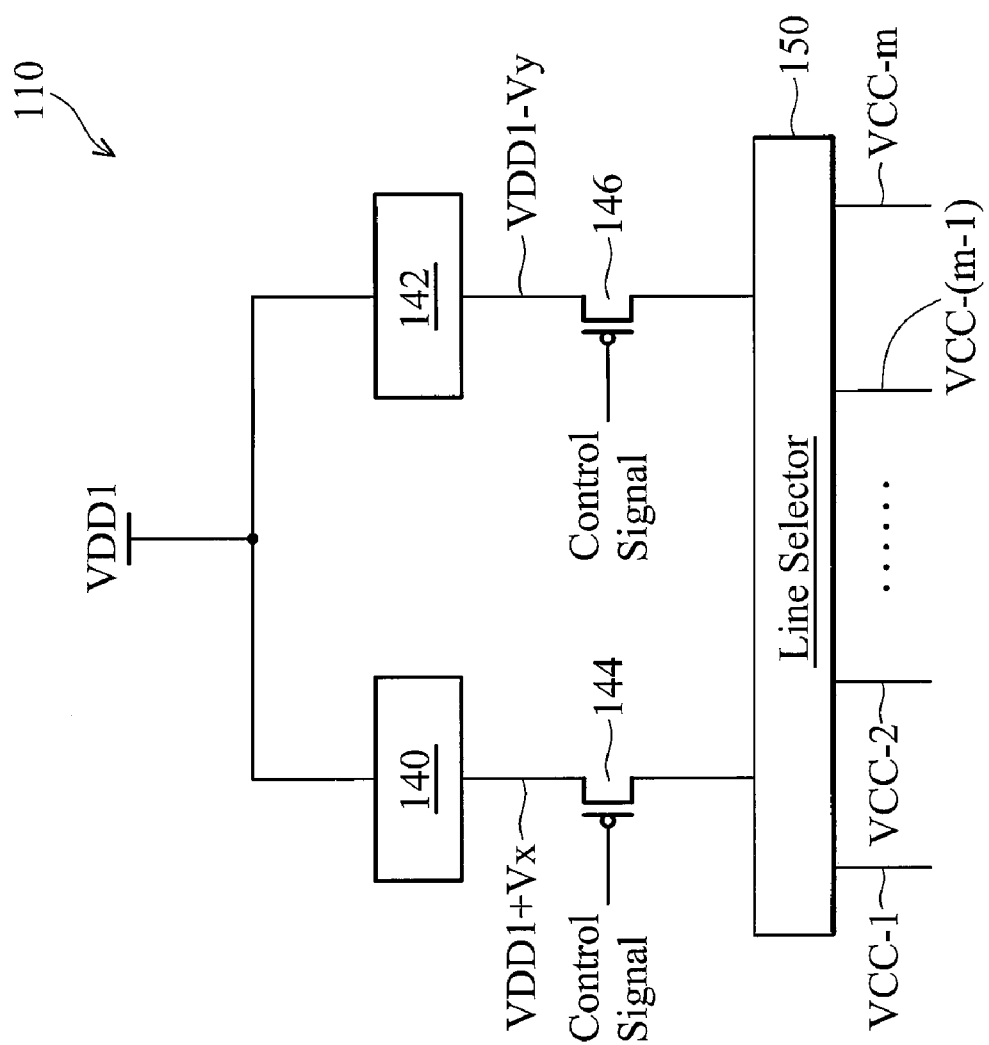
FIG. 4 illustrates a portion of a voltage generator.

FIG. 4 illustrates an implementation of voltage generator 110, which includes one or more voltage promoters 140 for raising voltage VDD1 to voltage VDD1+Vx, and one or more voltage attenuator 142 for reducing voltage VDD1 to voltage VDD1−Vy. Optimum values of voltage differences Vx and Vy are determined based on design requirements. Switches 144 and 146 controls which of (or both) the raised voltage VDD1+Vx or the reduced voltage VDD1−Vy should be sent to array SRAM 120 (refer to FIG. 2) based on control signals, wherein the control signals are related to whether the desired operation is a read operation or a write operation. Line selector 150 further multiplexes the generated voltages to desired lines. In the illustrated example as shown in FIG. 2, line selector 150 is a column selector, although in other embodiments it may be a row selector for multiplexing the generated voltages to lines in different rows, or a row and column selector. In an exemplary embodiment, if a read operation is to be performed to a selected SRAM cell in column 1, switch 144 connects voltage VDD1+Vx to line selector 150, which further routes voltage VDD1+Vx to line VCC-1. As is known in the art, increasing the VCC voltage of an SRAM cell in a read operation results in an increase in the read margin. As a result, even if the power supply voltage VDD1 is not high enough for the selected SRAM cell to perform the read operation, the generated VCC voltage, which is VDD1+Vx, is high enough for providing adequate read margins.

Generating VCC voltages VDD1+Vx and VDD1−Vy is significantly less complicated than the provided different power supply voltages. For example, increasing voltage VDD1 to VDD1+Vx may be achieved using a charge pump, while reducing voltage VDD1 to VDD1−Vy may be achieved using a MOS device. The details for increasing and reducing voltages are well known in the art, and thus are not discussed in detail herein.

On the other hand, if a write operation is to be performed to a selected SRAM cell in column 1, switch 146 connects voltage VDD1−Vy to line selector 150, which further routes voltage VDD1−Vy to line VCC-1. As is known in the art, reducing the VCC voltage of an SRAM cell in a write operation results in an increase in the write margin, and thus making a correct write operation possible even if the power supply voltage VDD1 does not provide adequate write margins.

In another implementation, the SRAM cells in array 120 are designed to be read-preferred, and thus power supply voltage VDD1 is appropriate for a correct read operation, although this will cause the write margin to be degraded. The read-preferred SRAM cells can be formed, for example, by increasing α and β ratios of the SRAM cells. The write margins of the SRAM cells in array 120 are compensated for by supplying a VCC voltage equaling VDD1−Vy. Meanwhile, voltage VDD1 can be used directly for read operations. Conversely, the SRAM cells in array 120 may be designed to be write-preferred, and thus power supply voltage VDD1 is appropriate for a correct write operation. This can be achieved, for example, by reducing α and β ratios of the SRAM cells. The read margins of the SRAM cells in array 120 are compensated by supplying a VCC voltage equaling VDD1+Vx. While the SRAM cells in array 120 are either read-preferred or write-preferred, SRAM cells in array 220 preferably have balanced read margins and write margins, so that power supply voltage VDD1 can operate the SRAM cells in array 220 without assistance. Adjusting one of the α and β ratios of the SRAM cells in array 120 or array 220 will cause the SRAM cells in array 120 to have different dimensions from the SRAM cells in array 220.

Figure 5:
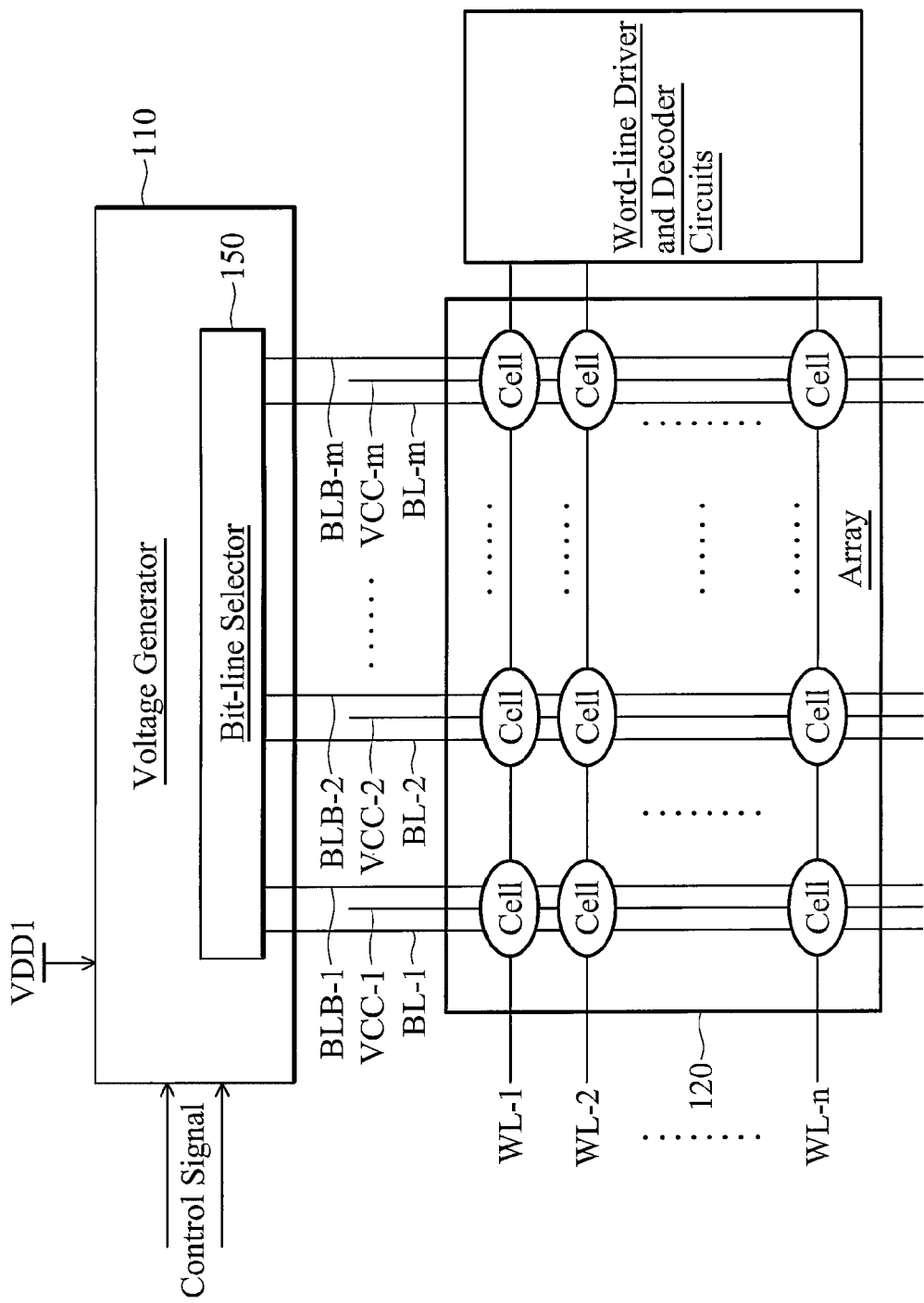
FIG. 5 schematically illustrates a voltage generator for generating generated voltages different from a power supply voltage, and a memory array whose bit-lines receive the generated voltages.

In yet other implementations, as shown in FIG. 5, voltage generator 110 further provides bit-lines BL-1 through BL-m and BLB-1 through BLB-m with the generated voltages, while VCC lines VCC-1 through VCC-m are connected to voltage VDD1. In this case, line selector 150 is a bit-line selector providing the generated voltages to desired bit-lines BL-1 through BL-m and BLB-1 through BLB-m. In an exemplary embodiment, when a selected SRAM cell in a column, for example, column 1 is to be read from, bit-lines BL-1 and BLB-1 are connected to voltage VDD1 through the multiplexing of bit-line selector 150. VCC line VCC-1 is also connected to VDD1. When a selected SRAM cell in column 1 is to be written into, VCC line VCC-1 is still connected to VDD1. However, bit-line selector 150 connects voltage VDD1 to bit-line BL-1, and a negative voltage −Vz to bit-line BLB-1. One skilled in the art will realize the generation of negative voltage −Vz.

In another exemplary embodiment, when a selected SRAM cell in column 1 is to be written into, a voltage higher than VDD1 is generated by voltage generator 110 and multiplexed to bit-lines BL-1 and BLB-1 through line selector 150. Conversely, when a selected SRAM cell in column 1 is to be read from, a generated voltage lower than VDD1 is generated by voltage generator 110 and multiplexed to bit-lines BL-1 and BLB-1. Furthermore, voltage generator 110 may generate a voltage lower than VDD1 to supply standby SRAM cells, so that the standby power consumption is reduced.

The embodiments of the present invention have shown that although core circuit 100 and core circuit 200 have different characteristics, by providing design solutions, such as voltage generator 110, core circuit 100 can advantageously share a common power supply voltage with core circuit 200. It is realized that core circuit 200 typically requires a lower operation voltage than that of core circuit 100. Therefore, without the design solution provided by the embodiments of the present invention, core circuit 100 may not function as desired.

By sharing a common power supply voltage between different core circuits, the cost for supplying extra power supply voltages is saved. Meanwhile, with the design solutions provided by the present invention, both benefits of high performance and low power consumption may be achieved on a same chip. A further advantageous feature of the present invention is that only one power supply voltage is needed regardless of the number of core circuits. For example, in FIG. 1, core circuit 200 may further include voltage generator 210 performing essentially the same functions as voltage generator 110. Core circuits 100, 200 and 400 may thus be operated on the same supply power voltage VDD1, even if the gate dielectrics of MOS devices in core circuit 400 have different thicknesses from gate dielectrics 102, 202 and 302.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit comprising:
   a first core circuit comprising a static random access memory (SRAM) array;
   a first MOS device in the SRAM array, wherein a first gate dielectric of the first MOS device has a first thickness;
   a second core circuit comprising a second MOS device, wherein a second gate dielectric of the second MOS device has a second thickness less than the first thickness;
   a first power supply line connected to the first and the second core circuits, wherein the first power supply line has a first power supply voltage; and
   a voltage generator connected to the first power supply line, wherein the voltage generator is configured to generate generated voltages higher or lower than the first power supply voltage, and wherein SRAM cells in the SRAM array are connected to the voltage generator.

2. The integrated circuit of claim 1, wherein the voltage generator further comprises a voltage promoter and a voltage attenuator for generating the generated voltages, and a line selector for multiplexing the generated voltages to a selected SRAM cell in the SRAM array.

3. The integrated circuit of claim 1 further comprising control signal lines connected to the voltage generator, wherein signals on the control signal lines are determined by an operation status of the SRAM array.

4. The integrated circuit of claim 1, wherein the second MOS device is in an additional SRAM array, and wherein the first power supply voltage is directly applied to SRAM cells in the additional SRAM array.

5. The integrated circuit of claim 1, wherein the voltage generator comprises a plurality of outputs, each connected to one of a plurality of VCC lines of the SRAM array, and wherein a first VCC line in the plurality of VCC lines is connected to a different output of the voltage generator from a second VCC line in the plurality of VCC lines.

6. The integrated circuit of claim 1, wherein the voltage generator comprises a plurality of outputs, each connected to one of a plurality of bit-lines of the SRAM array, and wherein a first bit-line in the plurality of bit-lines is connected to a different output of the voltage generator from a second bit-line in the plurality of bit-lines.

7. The integrated circuit of claim 1, wherein the first core circuit comprises first SRAM cells, the second core circuit comprises second SRAM cells, and wherein MOS devices in the first SRAM cells have different gate dielectric thicknesses than the second SRAM cells.

8. The integrated circuit of claim 1, wherein the integrated circuit further comprises:
   an input/output (I/O) circuit comprising a third MOS device, wherein a third gate dielectric of the third MOS device has a third thickness greater than the first thickness; and
   a second power supply line connected to the I/O circuit, wherein the second power supply line has a second power supply voltage higher than the first power supply voltage.

9. An integrated circuit comprising:
   an input/output (I/O) circuit comprising a first MOS device, wherein a first gate dielectric of the first MOS device has a first gate dielectric thickness;
   a first power supply line connected to the I/O circuit, wherein the first power supply line has a first power supply voltage;
   a second power supply line electrically isolated from the first power supply line, wherein the second power supply line has a second power supply voltage;
   a first core circuit comprising a second MOS device having a second gate dielectric thickness less than the first gate dielectric thickness, wherein the first core circuit comprises:
      a voltage generator connected to the second power supply line and outputting generated voltages different from the second power supply voltage to a plurality of outputs; and
      a first static random access memory (SRAM) array having a first plurality of VCC lines, each connected to one of the plurality of outputs of the voltage generator; and
   a second core circuit comprising a third MOS device having a third gate dielectric thickness less than the second gate dielectric thickness, wherein the second core circuit comprises a second SRAM array having a second plurality of VCC lines connected to the second power supply line.

10. The integrated circuit of claim 9, wherein the voltage generator further comprises a line selector for multiplexing the generated voltages to selected lines.

11. The integrated circuit of claim 10, wherein the selected lines are in a column direction.

12. The integrated circuit of claim 9, wherein SRAM cells in the first SRAM array are selected from the group consisting essentially of read-preferred SRAM cells and write-preferred SRAM cells, and wherein SRAM cells in the second SRAM array have balanced read margins and write margins.

13. An integrated circuit comprising:
   an input/output (I/O) circuit comprising a first MOS device, wherein a first gate dielectric of the first MOS device has a first thickness;
   a first power supply line having a first power supply voltage connected to the I/O circuit;
   a second power supply line having a second power supply voltage less than the first power supply voltage;
   a first core circuit comprising:
      a voltage generator connected to the second power supply line and outputting generated voltages different from the second power supply voltage to a plurality of outputs; and
      a first static random access memory (SRAM) array having a first plurality of lines selected from the group consisting essentially of VCC lines, bit-lines, and combinations thereof each connected to one of the plurality of outputs of the voltage generator; and
   a second core circuit comprising a second SRAM array having a second plurality of VCC lines connected to the second power supply line, wherein first SRAM cells in the first SRAM array and second SRAM cells in the second SRAM array have different dimensions.

14. The integrated circuit of claim 13, wherein the first SRAM cells have a different $\alpha$ ratio or a different $\beta$ ratio than the second SRAM cells.

15. The integrated circuit of claim 13, wherein the first core circuit further comprises a first logic circuit, and the second core circuit further comprises a second logic circuit, and wherein the first and the second logic circuits are connected to the second power supply line.

16. The integrated circuit of claim 13, wherein the first SRAM array comprises a plurality of bit-line nodes each connected to one of the plurality of outputs of the voltage generator.

17. The integrated circuit of claim 13, wherein the first SRAM cells have unbalanced read margins and write margins, and wherein the second SRAM cells have balanced read margins and write margins.

18. The integrated circuit of claim 13, wherein MOS devices in the first SRAM array have a different threshold voltage than MOS devices in the second SRAM array.

19. An integrated circuit comprising:
a first core circuit comprising a first MOS device, wherein a first gate dielectric of the first MOS device has a first thickness;
a second core circuit comprising a second MOS device, wherein a second gate dielectric of the second MOS device has a second thickness less than the first thickness;
a first power supply line connected to the first and the second core circuits, wherein the first power supply line has a first power supply voltage;
an input/output (I/O) circuit comprising a third MOS device, wherein a third gate dielectric of the third MOS device has a third thickness greater than the first thickness; and
a second power supply line connected to the I/O circuit, wherein the second power supply line has a second power supply voltage higher than the first power supply voltage.

20. The integrated circuit of claim 19, wherein the second MOS device is in an additional SRAM array, and wherein the first power supply line is coupled to SRAM cells in the additional SRAM array.

21. The integrated circuit of claim 19, wherein the first core circuit comprises first SRAM cells, the second core circuit comprises second SRAM cells, and wherein MOS devices in the first SRAM cells have different gate dielectric thicknesses than the second SRAM cells.

* * * * *